(12) United States Patent
Cheng et al.

(10) Patent No.: US 11,488,961 B2
(45) Date of Patent: Nov. 1, 2022

(54) SEMICONDUCTOR DEVICE (71) Applicant: NANYA TECHNOLOGY CORPORATION, New Taipei (TW)

(72) Inventors: Min-Chung Cheng, Taoyuan (TW); Chen-Tsung Liao, New Taipei (TW); Cheng-Wei Chiu, Tainan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 8 days.

(21) Appl. No.: 17/189,279

(22) Filed: Mar. 2, 2021

(65) Prior Publication Data
US 2022/0285359 A1 Sep. 8, 2022

(51) Int. Cl.
*H01L 27/108* (2006.01)

(52) U.S. Cl.
CPC .. *H01L 27/10823* (2013.01); *H01L 27/10876* (2013.01)

(58) Field of Classification Search
None
See application file for complete search history.

(56) References Cited

U.S. PATENT DOCUMENTS

2009/0294840 A1* 12/2009 Gilgen ............... H01L 27/0886
257/327
2018/0025947 A1* 1/2018 Hwang ........... H01L 21/823475
438/424

* cited by examiner

*Primary Examiner* — Hsien Ming Lee
(74) *Attorney, Agent, or Firm* — CKC & Partners Co., LLC (57) ABSTRACT

A semiconductor device includes a substrate, an oxide layer and a word line. The substrate has a plurality of protruding portions. Adjacent two of the protruding portions define a dense zone, and another adjacent two of the protruding portions define a loose zone. The oxide layer is disposed on the substrate. The word line is disposed on the substrate. A bottom surface of a portion of the word line in the dense zone and a bottom surface of a portion of the word line in the loose zone are substantially at the same height.

13 Claims, 9 Drawing Sheets

SEMICONDUCTOR DEVICE

BACKGROUND

Field of Invention

The present invention relates to a semiconductor device.

Description of Related Art

In a conventional fabrication process, active regions arranged alternatively may have regions with different widths. Specifically, regions between two ends of adjacent two active areas and other regions located between two parallel active areas may have different widths. Therefore, the channel depths formed through those regions may be different. As a result, the deviation of the amount of the metal filled in the channel may be different such that the electricity performance will be degraded.

Accordingly, how to provide a semiconductor device and a fabrication method of the semiconductor device so as to solve the problems described above is still one of the develop direction for those in the industry.

SUMMARY

One aspect of the present disclosure provides a semiconductor device.

In one embodiment of the present disclosure, the semiconductor device includes a substrate, an oxide layer and a word line. The substrate has a plurality of protruding portions. Adjacent two of the protruding portions define a dense zone, and another adjacent two of the protruding portions define a loose zone. The oxide layer is disposed on the substrate. The word line is disposed on the substrate. A bottom surface of a portion of the word line in the dense zone and a bottom surface of a portion of the word line in the loose zone are substantially at the same height.

In one embodiment of the present disclosure, the protruding portions are alternatively arranged.

In one embodiment of the present disclosure, a distance between the adjacent two of the protruding portions located at opposite sides of the dense zone is smaller than a distance between the adjacent two of the protruding portions located at opposite sides of the loose zone.

In one embodiment of the present disclosure, the protruding portions extend along a first direction, and the word line extends along a second direction different from the first direction.

In one embodiment of the present disclosure, a width of the dense zone is smaller than a width of the loose zone.

In one embodiment of the present disclosure, a thickness of the portion of the word line in the dense zone is substantially the same as a thickness of the portion of the word line in the loose zone.

In one embodiment of the present disclosure, a width of the portion of the word line in the dense zone is smaller than a width of the portion of the word line in the loose zone.

Another aspect of the present disclosure is a method of forming the semiconductor device.

In one embodiment of the present disclosure, the method includes providing a substrate and an oxide layer disposed on the substrate, wherein the substrate has a plurality of protruding portions; forming a trench in the substrate and the oxide layer, and adjacent two of the protruding portions define a dense zone of the trench, and another adjacent two of the protruding portions define a loose zone of the trench; and filling a metal in the trench such that a bottom surface of a portion of the metal in the dense zone and a bottom surface of a portion of the metal in the loose zone are substantially at the same height.

In one embodiment of the present disclosure, forming the trench such that a bottom surface of the dense zone of the trench and a bottom surface of the loose zone of the trench are at substantially at the same height.

In one embodiment of the present disclosure, forming the trench further comprises adding polymer gas, and the polymer gas comprises at least one of the $C_4F_6$, $CH_2F_2$, $CHF_3$, or any combination thereof.

In one embodiment of the present disclosure, a flow rate of the polymer gas is in a range of about 1 sccm to 3 sccm.

In one embodiment of the present disclosure, forming the trench is performed by etching.

In one embodiment of the present disclosure, forming the trench further includes reducing an etching selectivity between silicon and oxide.

In one embodiment of the present disclosure, an etching rate of the dense zone is substantially the same as an etching rate of the loose zone.

In one embodiment of the present disclosure, filling a metal in the trench such that a depth of the metal in the dense zone is substantially the same as a depth of the metal in the loose zone.

In one embodiment of the present disclosure, filling a metal in the trench such that a width of the metal in the dense zone is smaller than a width of the metal in the loose zone.

In the aforementioned embodiments, by adding the polymer gas G containing at least one of the $C_4F_6$, $CH_2F_2$, $CHF_3$, or any combination thereof during the etching process. The depth of the trench corresponding to the loose zone and the dense zone may be substantially the same. That is, a bottom surface of a portion of the word line in the dense zone and a bottom surface of a portion of the word line in the loose zone are substantially at the same height. As such, the metal filled into the loose zone and the dense zone of the trench may have the same thickness. Therefore, the electrical performance of the semiconductor device may be improved.

BRIEF DESCRIPTION OF THE DRAWINGS

The invention can be more fully understood by reading the following detailed description of the embodiment, with reference made to the accompanying drawings as follows:

FIG. 4 is a flow chart of a method of forming the semiconductor device in

FIG. 1;

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 1:
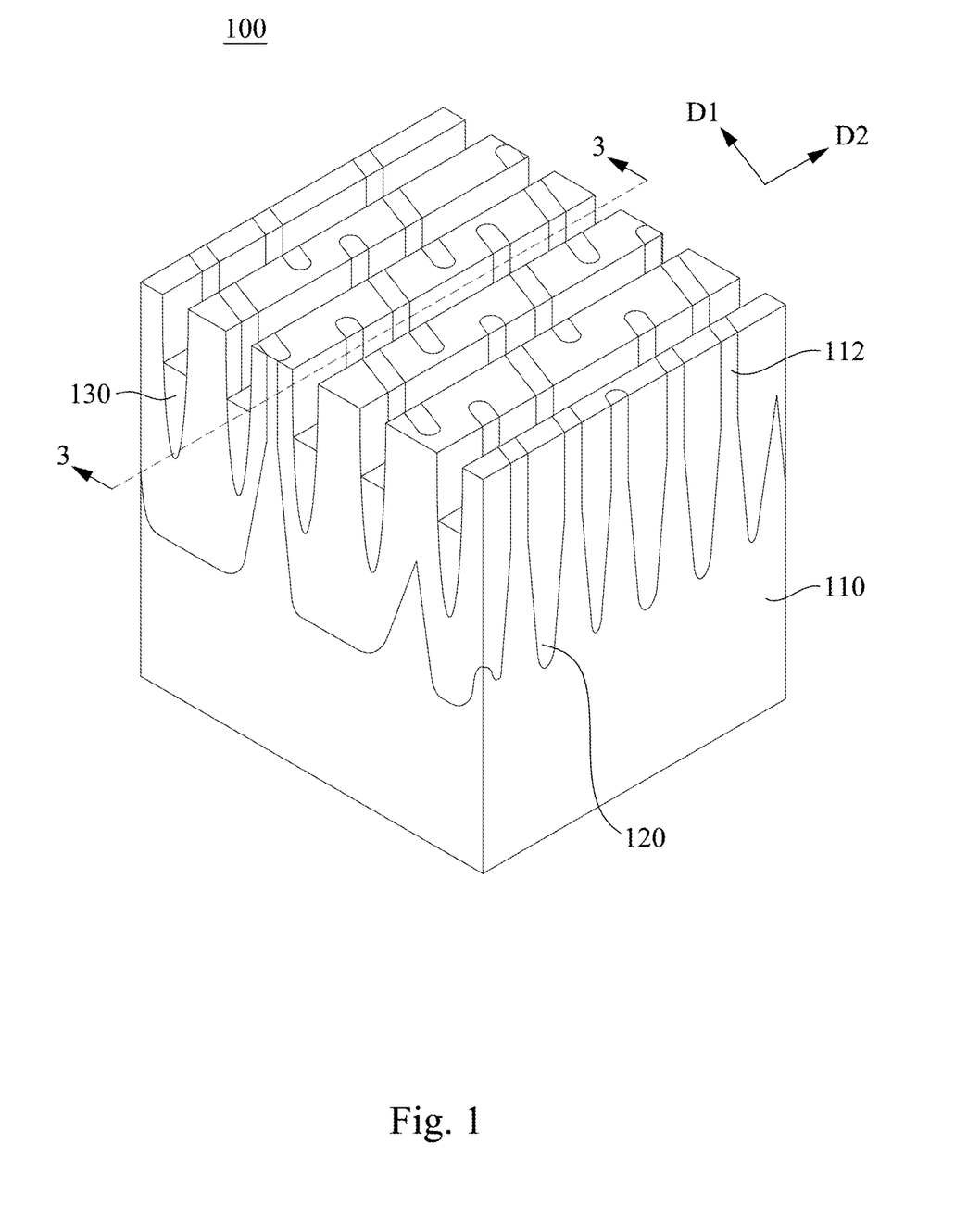
FIG. 1 is a schematic diagram of an semiconductor device according to one embodiment of the present disclosure.

FIG. 1 is a schematic diagram of a semiconductor device 100 according to one embodiment of the present disclosure. The semiconductor device 100 includes a substrate 110, an oxide layer 120, and word lines 130. The substrate 110 has a plurality of protruding portions 112. The oxide layer 120 is disposed on the substrate 110. The word line 130 is disposed on the substrate 110. As shown in FIG. 1, protruding portions 112 extend along a first direction D1 when viewed from above, and the word lines 130 extend along a second direction D2 different from the first direction D1. The protruding portions 112 define the active area of the semiconductor device 100. Specifically, the first direction D1 and the second direction D2 form an angle smaller than 90 degrees. The protruding portions 112 are alternatively arranged along the first direction D1 and the second direction D2.

Figure 2:
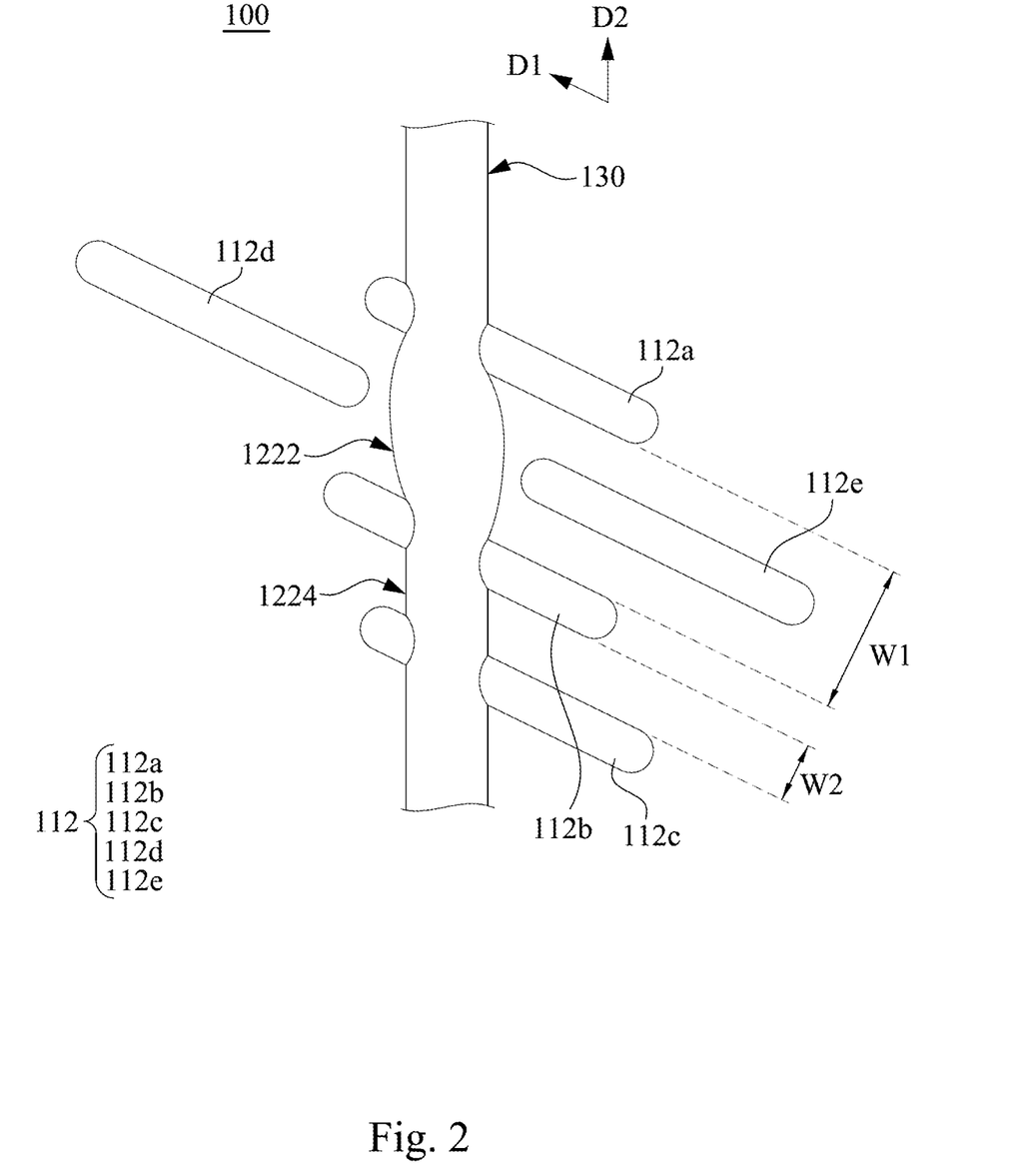
FIG. 2 is a partial top view of the semiconductor device in FIG. 1.
Figure 3:
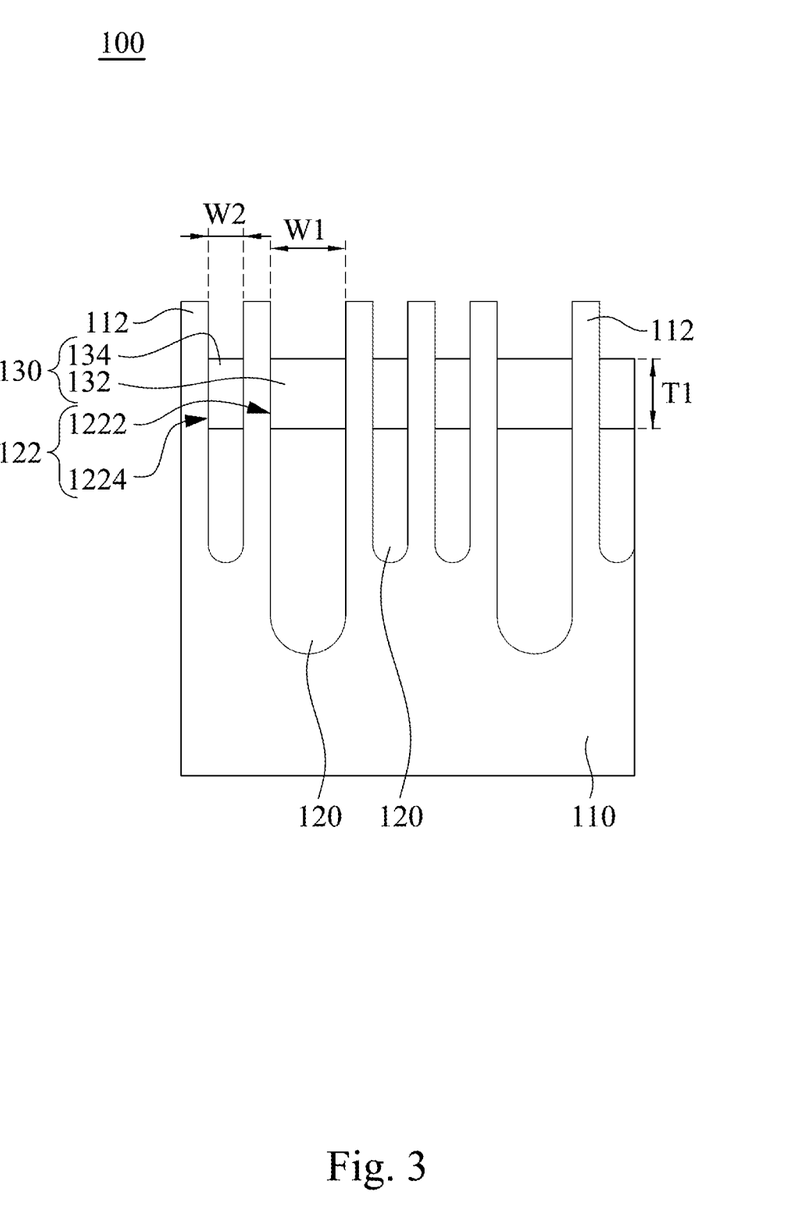
FIG. 3 is a cross-sectional view of the semiconductor device taken along line 3-3 in FIG. 1.

FIG. 2 is a partial top view of the semiconductor device 100 in FIG. 1. FIG. 3 is a cross-sectional view of the semiconductor device 100 taken along line 3-3 in FIG. 1. As shown in FIG. 2, adjacent two of the protruding portions (e.g., protruding portion 112a and protruding portion 112b) arranged along the second direction D2 define a loose zone 1222. Adjacent two of the protruding portions (e.g., protruding portion 112b and protruding portion 112c) define a dense zone 1224. Specifically, protruding portion 112d and protruding portion 112e arranged along the first direction D1 are located at opposite sides of the loose zone 1222. As shown in FIG. 3, a portion 132 of the word line 130 is located in the loose zone 1222, and a portion 134 of the word line 130 is located in the dense zone 1224. That is, a bottom surface of the portion 134 in the dense zone 1224 and a bottom surface of the portion 132 in the loose zone 1222 are substantially at the same height.

As shown in FIG. 2 and FIG. 3, a distance between the adjacent two of the protruding portions 112 located at opposite sides of the dense zone 1224 is smaller than a distance between the adjacent two of the protruding portions 122 located at opposite sides of the loose zone 1222. In other words, a width W2 of the dense zone 1224 is smaller than a width W1 of the loose zone 1222. That is, a width of the portion 134 of the word line 130 in the dense zone 1224 is smaller than a width of the portion 132 of the word 130 line in the loose zone 1222 along the second direction D2.

Since the distance between the adjacent two of the protruding portions 122 located at opposite sides of the loose zone 1222 is greater than the distance between the adjacent two of the protruding portions 112 located at opposite sides of the dense zone 1224, the depth of the loose zone 1222 should be greater than the depth of the dense zone 1224 when the oxide layer 120 is etched. However, as shown in FIG. 3, a depth of the dense zone 1224 is substantially the same as a depth of the loose zone 1222 such that a thickness T1 of the portion 134 of the word line 130 in the dense zone 1224 is substantially the same as the thickness T1 of the portion 132 of the word line 130 in the loose zone 1222. As such, the electrical performance of the electronic device connected with the word line 130 may be improved. That is, if the depth of the loose zone 1222 and the depth of the dense zone 1224 are substantially the same, the thicknesses T1 of the portion 132 and the portion 134 of the word line 130 may be substantially the same. In other words, by forming the trenches with the same depth where the portion 132 and the portion 134 of the word line 130 are located, the electrical performance of the semiconductor device 100 may be improved. The method of forming such configuration of the semiconductor device 100 will be described later.

Figure 4:
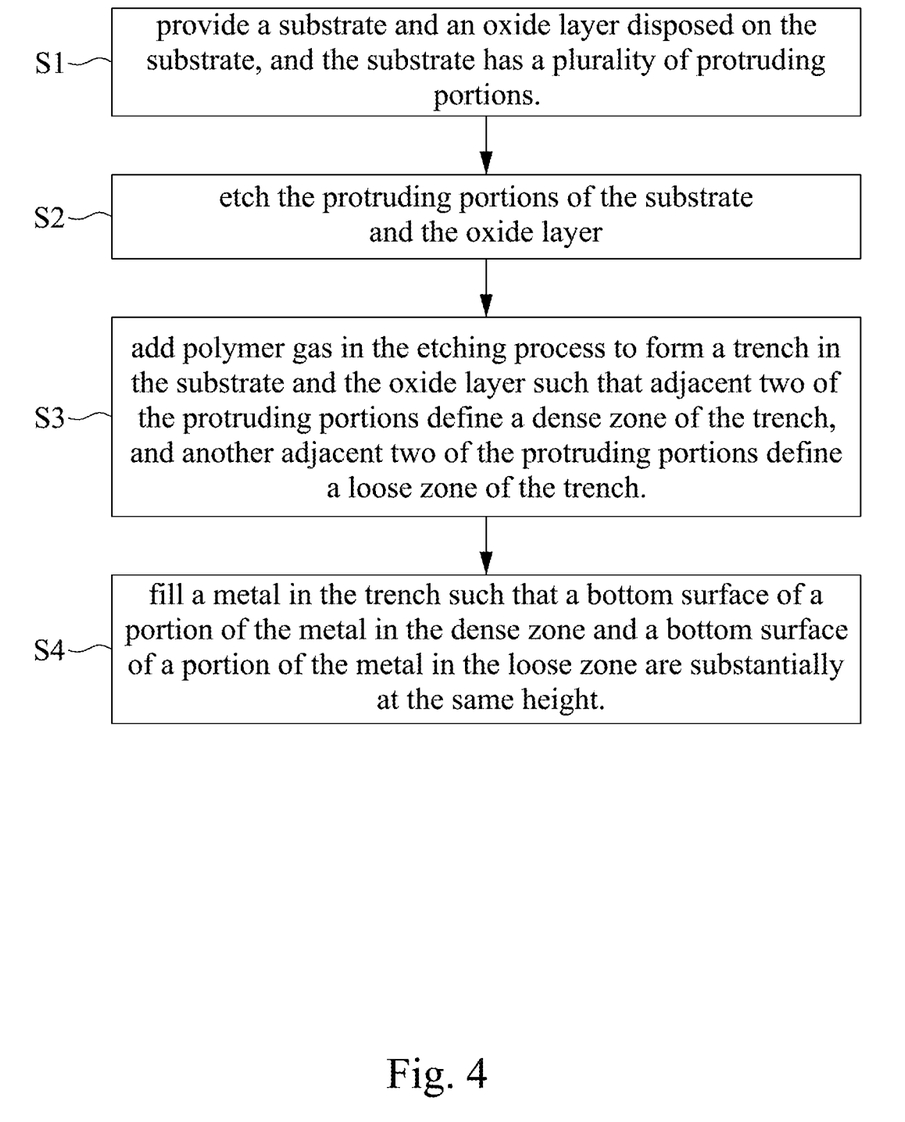

FIG. 4 is a flow chart of a method of forming the semiconductor device 100 in FIG. 1. The method begins from step S1 in which the substrate 110 and the oxide layer 120 disposed on the substrate 110 is provided. The substrate 110 has a plurality of protruding portions 112. Thereafter, in step S2, the protruding portions 112 of the substrate 110 and the oxide layer 120 are etched. Next, in step S3, adding polymer gas G in the etching process to form a trench 122 in the substrate 110 and the oxide layer 120 such that adjacent two of the protruding portions 112 define a dense zone 1224 of the trench 122, and another adjacent two of the protruding portions 112 define a loose zone 1222 of the trench. Subsequently, in step S4, a metal is filled in the trench 122 to form the word line 130.

Figure 5:
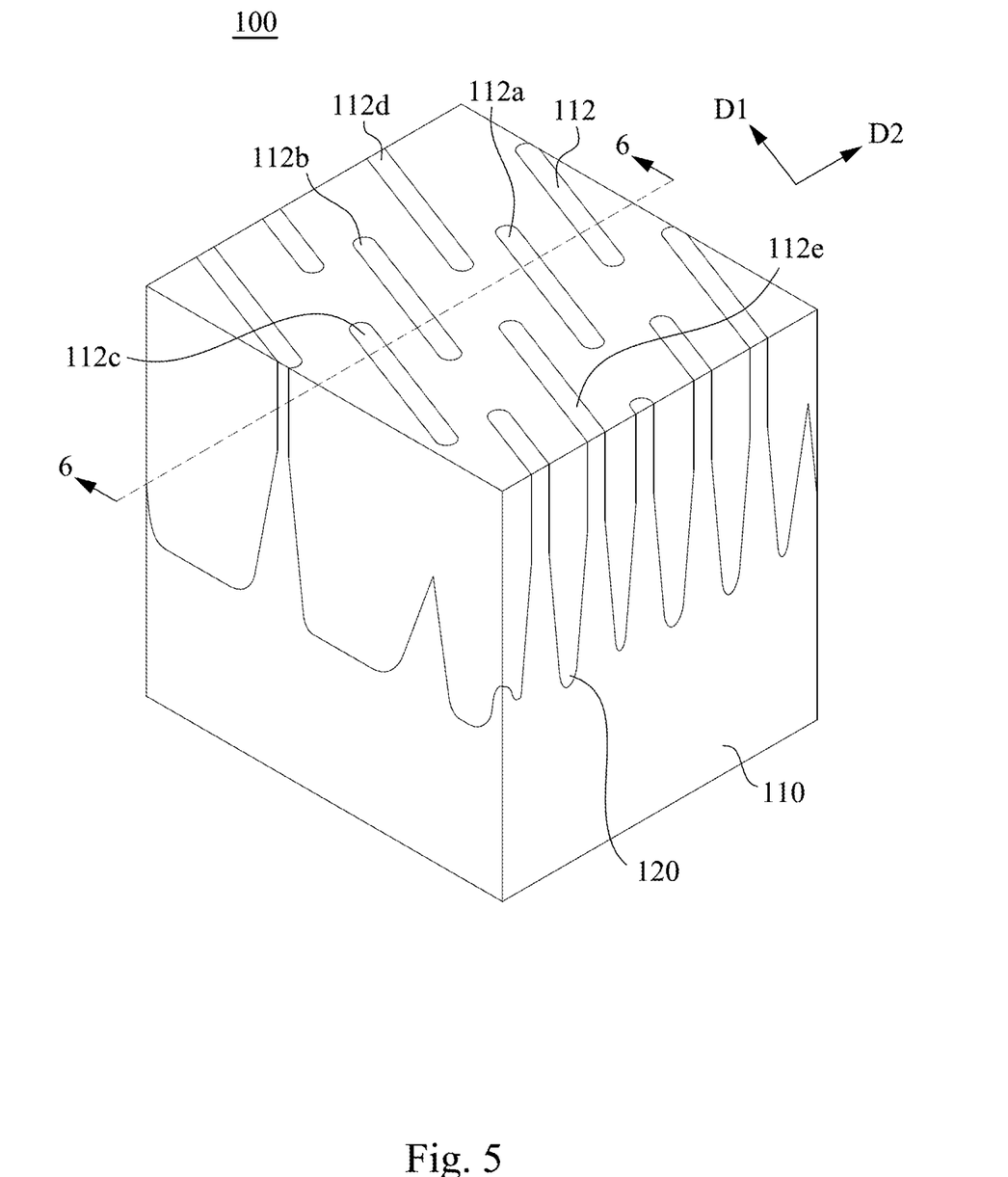
FIG. 5 is a schematic diagram of an intermediate stage of the method of forming a semiconductor device in FIG. 4.
Figure 6:
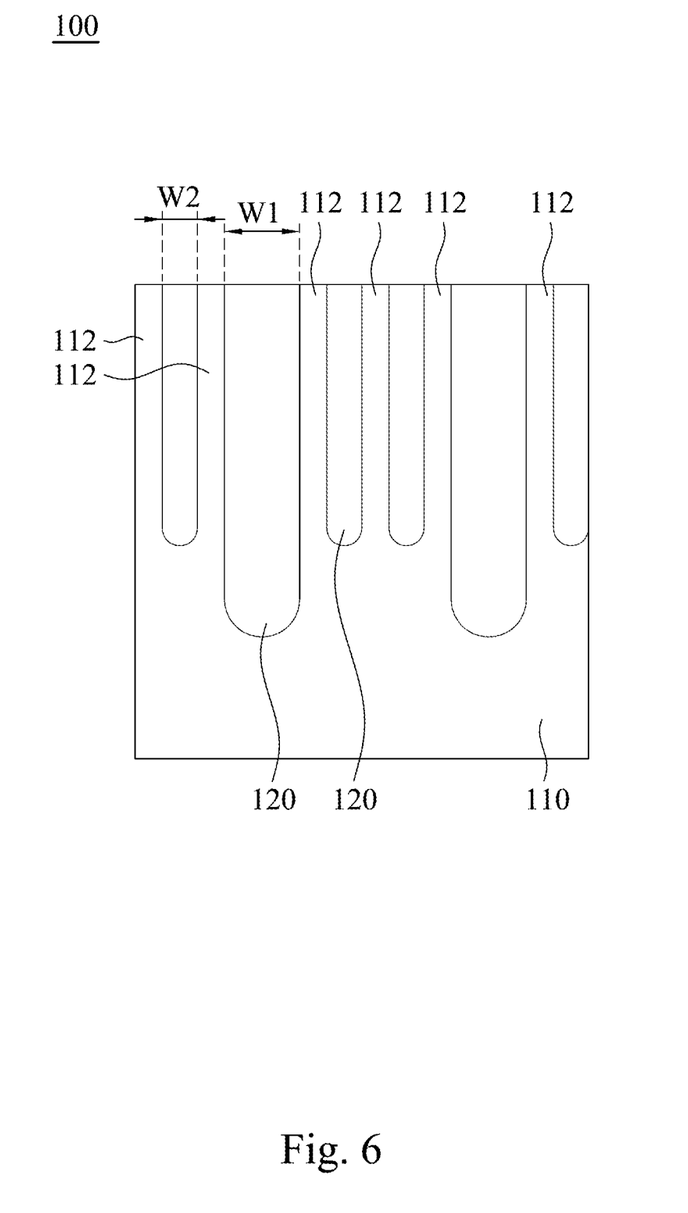
FIG. 6 is a cross-sectional view of the semiconductor device taken along line 6-6 in FIG. 5.

FIG. 5 is a schematic diagram of an intermediate stage of the method of forming the semiconductor device 100 in FIG. 4. FIG. 6 is a cross-sectional view of the semiconductor device 100 taken along line 6-6 in FIG. 5. FIG. 5 has the same cross-sectional position as FIG. 3. Reference is made to FIG. 4 to FIG. 6. In the method of forming the semiconductor device 100, the substrate 110 and an oxide layer 120 disposed on the substrate 110 are provided. The substrate 110 has a plurality of protruding portions 112 alternatively arranged. As described above, the protruding portions 112 are arranged along the first direction D1 and the second direction D2 such that the distance between adjacent two protruding portions 112 (e.g., the protruding portion 112a and the protruding portion 112b) is greater than a distance between another adjacent two protruding portions 112 (e.g., the protruding portion 112b and the protruding portion 112c). As shown in FIG. 6, the width W2 between adjacent two protruding portions 112 is smaller than the width W1 between another adjacent two protruding portions.

Figure 7:
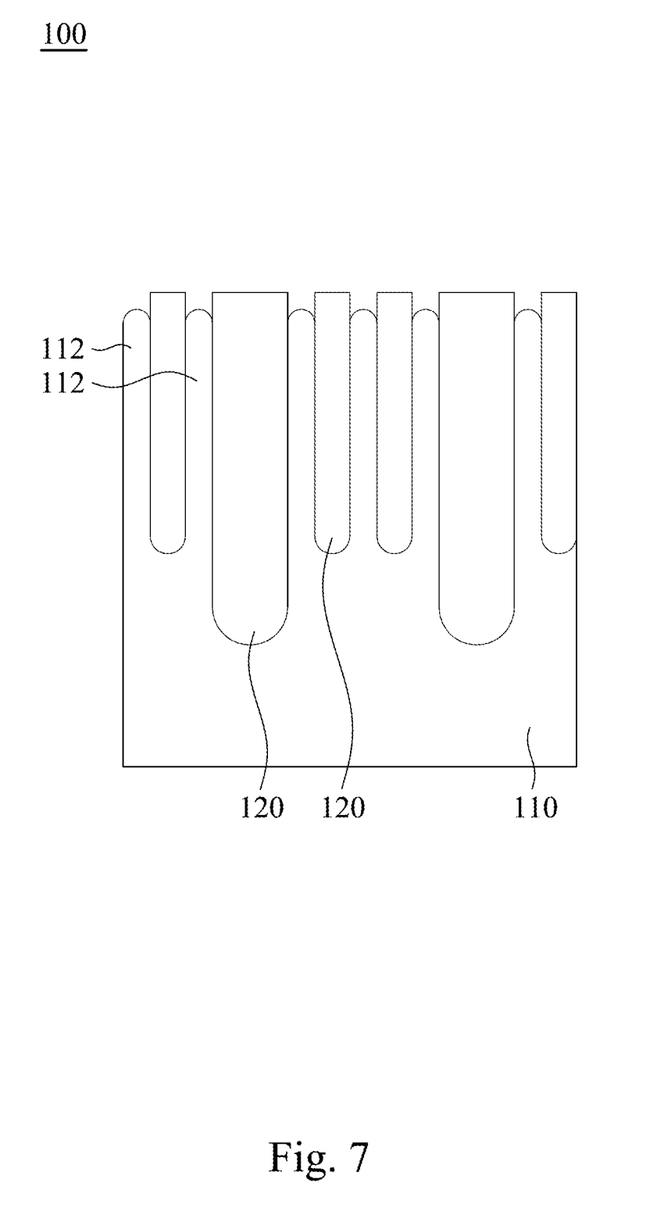
FIG. 7 is a cross-sectional view of an intermediate stage of the method of forming the semiconductor device in FIG. 4.

FIG. 7 is a cross-sectional view of an intermediate stage of the method of forming the semiconductor device 100 in FIG. 4. FIG. 7 has the same cross-sectional position as FIG. 6. Reference is made to FIG. 4 and FIG. 7. In the method of forming the semiconductor device 100, the protruding portions 112 of the substrate 110 and the oxide layer 120 are etched by using photolithography process to form the trench 122 (see FIG. 3). Specifically, etching of the protruding portions 112 and the oxide layer 120 are performed such that the selectivity between the oxide layer 120 and the substrate 110 is adjusted. As a result, each of the etched protruding portions 112 has a substantially convex top surface. For example, the profile of the etched protruding portions 112 can be adjusted by using the pulsing power in a range of about 200 watts to 300 watts, the duty cycle in a range of about 50% to 70%, and the frequency of about 100 to 300, but the present disclosure is not limited in this regards.

Figure 8:
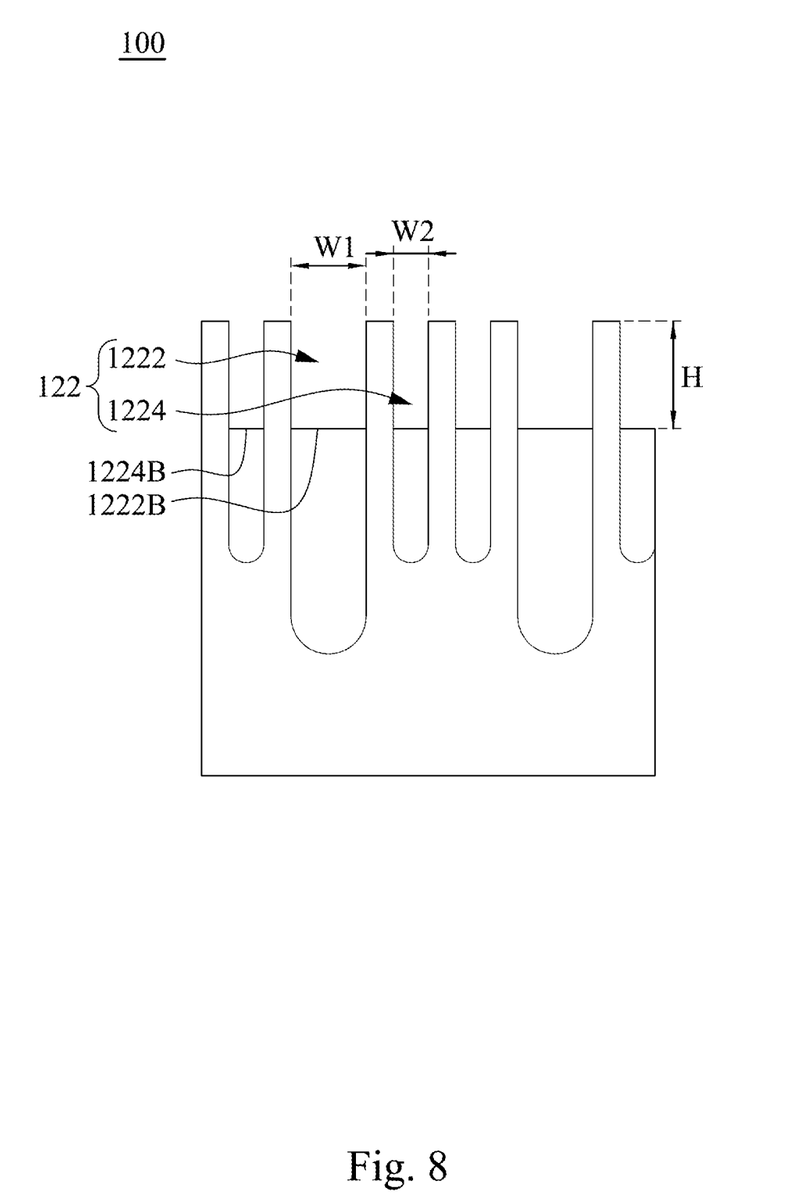
FIG. 8 is cross-sectional view of an intermediate stage of the method of forming the semiconductor device in FIG. 4.
Figure 9:
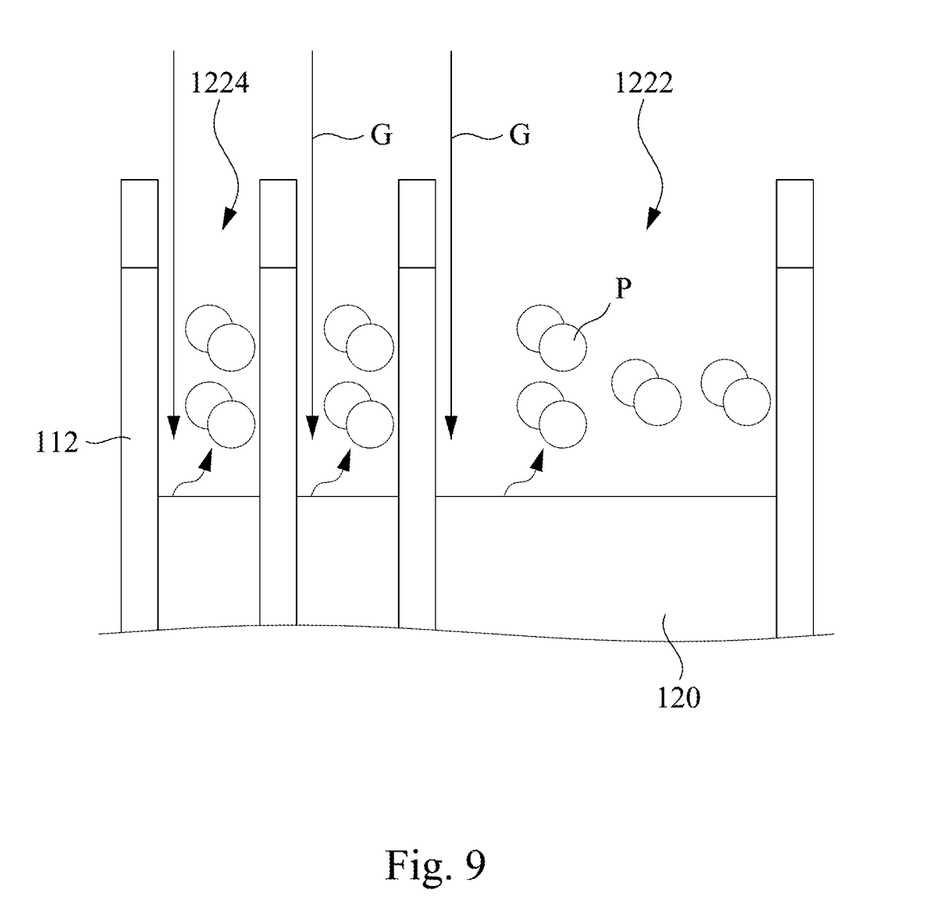
FIG. 9 is a schematic diagram of an intermediate stage of the method of forming the semiconductor device in FIG. 4.

FIG. 8 is cross-sectional view of an intermediate stage of the method of forming the semiconductor device 100 in FIG. 4. FIG. 9 is a schematic diagram of an intermediate stage of the method of forming the semiconductor device 100 in FIG. 4. FIG. 9 demonstrates the chemical interaction during the etching process in FIG. 8. Reference is made to FIG. 4, FIG. 8, and FIG. 9. Forming the trench 122 includes adding polymer gas G in the etching process. The polymer gas G includes at least one of the $C_4F_6$, $CH_2F_2$, $CHF_3$, or any combination thereof. A flow rate of the polymer gas G is in a range of about 1 sccm (Standard Cubic Centimeters per Minute) to 3 sccm. In addition, each of the etched protruding portions 112 substantially has a square shape after the etching process.

As shown in FIG. 8, during the etching process, adjacent two of the protruding portions 122 define a dense zone 1224 of the trench 122, and another adjacent two of the protruding portions 122 define a loose zone 1222 of the trench 122. Since the width W1 of the loose zone 1222 is greater than the width W2 of the dense zone 1224, it is more difficult for the etchant to pass through the dene zone 1224 than the loose zone 1222. Similarly, it is more difficult for the by-products in the dense zone 1224 to diffuse out than the loose zone 1222. Therefore, the etching rate in the loose zone 1222 may be greater than the etching rate in the dense zone 1221.

However, as shown in FIG. 9, by adding the polymer gas G, concentration of the by-products P is increased so as to reduce the etching rate in the loose zone 1222. As a result, an etching rate of the dense zone 1224 can be adjusted to be substantially the same as an etching rate of the loose zone 1222. Specifically, the etching rate of the loose zone 1222 is reduced to be close to the etching rate of the dense zone 1224. Therefore, by adding the polymer gas G, the depth H of the loose zone 1222 and the depth H of the dense zone 1224 are substantially the same after the etching process.

Reference is made to FIG. 3, the method of forming the semiconductor device 100 further includes filling a metal (e.g., tungsten) in the trench 122 to form the word line 130. As such, a depth of the portion of the metal in the dense zone 1224 is substantially the same as a depth of the portion of the metal in the loose zone 1222. In other words, a bottom surface of a portion of the metal in the dense zone 1224 and a bottom surface of a portion of the metal in the loose zone 1222 are substantially at the same height. In the subsequent process, contact structures and capacitors may be formed above the active area (e.g., source/drain region formed in the protruding portions 112). As such, the electrical performance of the semiconductor device 100 may be improved through the method described aforementioned.

As described above, by adding the polymer gas G containing at least one of the $C_4F_6$, $CH_2F_2$, $CHF_3$, or any combination thereof during the etching process. The depth of the trench corresponding to the loose zone and the dense zone may be substantially the same. That is, a bottom surface of a portion of the word line in the dense zone and a bottom surface of a portion of the word line in the loose zone are substantially at the same height. As such, the metal filled into the loose zone and the dense zone of the trench may have the same thickness. Therefore, the electrical performance of the semiconductor device may be improved.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor device, comprising:
   a substrate having a plurality of protruding portions, wherein adjacent two of the protruding portions define a dense zone, and another adjacent two of the protruding portions define a loose zone;
   an oxide layer disposed on the substrate; and
   a word line disposed on the substrate, wherein a bottom surface of a portion of the word line in the dense zone and a bottom surface of a portion of the word line in the loose zone are substantially at the same height, a depth of the dense zone is greater than a thickness of a portion of the word line in the loose zone, and a depth of the loose zone is greater than a thickness of a portion of the word line in the loose zone.

2. The semiconductor device of claim 1, wherein the protruding portions are alternatively arranged.

3. The semiconductor device of claim 1, wherein a distance between the adjacent two of the protruding portions located at opposite sides of the dense zone is smaller than a distance between the adjacent two of the protruding portions located at opposite sides of the loose zone.

4. The semiconductor device of claim 1, wherein the protruding portions extend along a first direction, the word line extends along a second direction different from the first direction.

5. The semiconductor device of claim 1, wherein a width of the dense zone is smaller than a width of the loose zone.

6. The semiconductor device of claim 1, wherein a thickness of the portion of the word line in the dense zone is substantially the same as a thickness of the portion of the word line in the loose zone.

7. The semiconductor device of claim 1, wherein a width of the portion of the word line in the dense zone is smaller than a width of the portion of the word line in the loose zone.

8. A method of forming the semiconductor device, comprising:
   providing a substrate and an oxide layer disposed on the substrate, wherein the substrate has a plurality of protruding portions;
   forming a trench in the substrate and the oxide layer, and adjacent two of the protruding portions define a dense zone of the trench, and another adjacent two of the protruding portions define a loose zone of the trench, wherein forming the trench is performed by etching, forming the trench comprises adding polymer gas, the polymer gas comprises at least one of the $C_4F_6$, $CH_2F_2$, $CHF_3$, or any combination thereof, and wherein an etching rate of the dense zone is substantially the same as an etching rate of the loose zone; and
   filling a metal in the trench such that a bottom surface of a portion of the metal in the dense zone and a bottom surface of a portion of the metal in the loose zone are substantially at the same height.

9. The method of claim 8, wherein forming the trench such that a bottom surface of the dense zone of the trench and a bottom surface of the loose zone of the trench are at substantially at the same height.

10. The method of claim 8, wherein a flow rate of the polymer gas is in a range of about 1 sccm to 3 sccm.

11. The method of claim 8, wherein forming the trench further comprises reducing an etching selectivity between silicon and oxide.

12. The method of claim 8, wherein filling a metal in the trench such that a depth of the metal in the dense zone is substantially the same as a depth of the metal in the loose zone.

13. The method of claim 8, wherein filling a metal in the trench such that a width of the metal in the dense zone is smaller than a width of the metal in the loose zone.

* * * * *